United States Patent [19]
Yu et al.

[11] Patent Number: 5,706,473
[45] Date of Patent: Jan. 6, 1998

[54] COMPUTER MODEL OF A FINITE STATE MACHINE HAVING INPUTS, OUTPUTS, DELAYED INPUTS AND DELAYED OUTPUTS

[75] Inventors: Tonny Kai Tong Yu, Fremont; Shir-Shen Chang, Palo Alto; Janet Lynn O'Neil, Santa Clara, all of Calif.

[73] Assignee: Synopsys, Inc., Mountain View, Calif.

[21] Appl. No.: 414,794

[22] Filed: Mar. 31, 1995

[51] Int. Cl.$^6$ .................................. G06G 7/48; G06F 3/00
[52] U.S. Cl. .................. 395/500; 364/578; 395/706; 395/183.15
[58] Field of Search ........................ 395/500, 446, 395/800, 161, 700, 200.1, 600, 650, 24, 375, 701–706, 183.13, 183.15, 185.02, 185.03, 185.04, 551, 552; 364/578, 488–491, 141, 190, 191, 140, 143, 149, 150; 327/141, 269; 326/46, 93, 38; 340/825.5; 341/106; 371/24

[56] References Cited

U.S. PATENT DOCUMENTS

| | | | |
|---|---|---|---|
| 4,740,891 | 4/1988 | Kirkpatrick | 395/800 |
| 4,799,141 | 1/1989 | Drusinsky et al. | 364/141 |
| 4,862,347 | 8/1989 | Rudy | 395/500 |
| 5,051,938 | 9/1991 | Hyduke | 364/578 |
| 5,163,016 | 11/1992 | Har'El et al. | 364/578 |
| 5,253,363 | 10/1993 | Hyman | 395/800 |
| 5,313,615 | 5/1994 | Newman et al. | 364/578 |
| 5,325,528 | 6/1994 | Klein | 395/650 |
| 5,325,533 | 6/1994 | McInerney et al. | 395/700 |
| 5,371,878 | 12/1994 | Coker | 395/500 |
| 5,389,838 | 2/1995 | Orengo | 326/46 |
| 5,414,812 | 5/1995 | Filip et al. | 395/700 |
| 5,485,600 | 1/1996 | Joseph et al. | 395/500 |
| 5,539,680 | 7/1996 | Palnitkar et al. | 364/578 |
| 5,542,034 | 7/1996 | Petler | 395/500 |

*Primary Examiner*—Kevin J. Teska
*Assistant Examiner*—Jacques Louis-Jacques
*Attorney, Agent, or Firm*—Wilson Sonsini Goodrich & Rosati

[57] ABSTRACT

A computer system having a computer model of a Finite State Machine (FSM). The computer system includes a processor coupled to receive and manipulate the computer model, and a memory. The memory includes a computer model. The computer model includes, a first set of inputs, a first set of delayed inputs, a first set of outputs and a first set of delayed outputs. The computer model has a first output of the first set of outputs corresponding to a first input of the first set of inputs, a first delayed input of the first set of inputs and a first delayed output of the first set of delayed outputs.

16 Claims, 8 Drawing Sheets

COMPUTER MODEL OF A FINITE STATE MACHINE HAVING INPUTS, OUTPUTS, DELAYED INPUTS AND DELAYED OUTPUTS

BACKGROUND OF THE INVENTION

1. Field of Invention

The present invention relates to the field of computer aided design of circuits. In particular, the present invention describes an improved computer model of a finite state machine that can be used in logic simulation and synthesis.

2. Description of Related Art

Circuit designers design two types of digital circuits: combinational circuits, and sequential circuits. Combinational circuits are time-independent; the outputs of a combinational circuit depend only on the present inputs. Some sequential circuits, called Moore machines, have outputs that depend on a sequence of previous inputs. Other sequential circuits, called Mealy machines, have outputs that depend on the sequence of previous inputs and the current input. Each sequence of previous inputs causes the circuit to assume a specific state for the sequential circuit. Because sequential circuits have a finite number of these states, sequential circuits are referred to as finite state machines (FSMs).

The behavior of an FSM is described in terms of state transitions. At an instant in time, the FSM is considered to be in the present state. When a synchronizing event occurs (for example, a rising edge of a clock), an FSM makes a transition to a next state.

FIG. 2 illustrates an FSM 200. The FSM 200 includes two optional combinational circuit blocks: the next state circuits 260 and the output circuits 250. The next state circuits 260 is fed by the primary inputs 210 and the present state 240. The next state circuits 260 generates the next state 230. The next state 230 is stored in the state vector memory elements 225. The state vector memory elements 225 typically include a number of memory elements such as D flip-flops. The output circuits 250 generate the primary outputs 220 for the FSM 200. The output circuits 250 have as inputs the primary inputs 210 and the present state 240.

The circuit of the FSM 200 can be modeled in a computer system. A computer system can then manipulate the computer model for the purposes of simulation, synthesis, and optimization. Simulation reports on the response of the FSM 200 to specific stimuli applied as the primary inputs 210 and is useful in verifying the behavior of the circuit. Synthesis automatically builds circuits that implement the FSM 200. Optimization improves the area and performance of circuits.

Ideally, the computer model should be memory efficient, easy to specify, an accurate and precise representation of the FSM 200, and easily and quickly manipulated by computer systems. The level of abstraction of the computer model dictates the type of computer program that can be used. Some computer programs use low-level, analog computer models. Other computer programs use digital computer models such as behavioral computer models.

Analog computer models define circuits by their low level device characteristics such as gate widths, capacitance, and doping levels. SPICE, for example, allows users to define and simulate circuits at a transistor level. Analog computer models often provide more information to the user than may be needed. That is, the level of abstraction from the actual circuit is not high enough. Often, a great deal of computing is required to use even a basic analog computer model.

Digital computer models define circuits by higher level characteristics. Digital computer models define the ones and zeroes that represent the states, the inputs and the outputs for a circuit. For example, a digital computer model can define the high level behavior of the circuit such as a behavioral model of a telephone switching system. A different kind of digital computer model is a netlist computer model. A netlist computer model defines a number of interconnected primitive models. Each primitive model is a model of a primitive digital device such as an AND gate, OR gate, a D flip-flop, or a multiplexor.

FIG. 3 illustrates a behavioral computer model 341. The behavioral computer model 341 provides a high level of abstraction. The behavioral computer model 341 is distinguished over an analog computer model in that the behavioral computer model 341 is digital (models circuits as ones and zeros), is represented in a high level language, and does not model the device level behavior of the FSM 200. The behavioral computer model 341 is often a software program. For example, the behavioral computer model 341 of FSM 200 can be written in the C programming language. The behavioral computer model 341 can be very flexible and can model the FSM 200 in minute detail, but does not necessarily reflect the gate level implementation of the FSM 200. The behavioral computer model 341 of FSM 200 is typically very verbose, and therefore, difficult for a user to specify and maintain. Because the behavioral computer model 341 provides such a high level of abstraction, it can be difficult for computer programs to efficiently optimize and store. Behavioral inputs 311 are typically a sequence of ones and zeroes. Behavioral outputs 321 are typically a sequence of logic values that define a sequence of states of the behavioral computer model 341.

A typical netlist computer model defined a set of primitive models and their interconnections. Each primitive model defined the basic function of a gate level device. For example, a two input AND gate primitive model defines that when both inputs are one, the output is one, otherwise the output is zero. A computer model of FSM 200 can be built up from a list of primitive models and a corresponding interconnection list. A netlist computer model of FSM 200, compared to a behavioral computer model may be easier for the user to specify. The netlist computer model is more computer memory efficient because less detailed information is required to define the netlist computer model. However, a netlist computer model is not as general purpose, therefore it may not provide a high enough level of abstraction for some users.

FIG. 3 also illustrates two other types of netlist computer models: a user defined primitive (UDP) computer model 302, and a fully programmable simulation model (FPSM) computer model 303. A UDP allows a user to predefine a logical function for a primitive. The user defines a number of inputs for that UDP, but only one output. Such a computer model is available from Cadence of San Jose, Calif. For example, an AND gate can be defined with an arbitrary number of inputs. Because only one output can be defined, a single UDP can only support a two state FSM (the first state when the output is one, the second state when the output is zero). However, next state circuits 260 and state vector memory elements 225 can have many more than two states. Therefore, for UDP computer model 302 to define FSM 200 with more than two states, a UDP network 342 must be used. That is, UDP network 342 defines a number of connections between UDPs—a netlist of UDPs. The UDP network 342 can model the next state circuits 260 and the state vector memory elements 225, while another network of UDPs, UDP output logic 332, can model the output circuit 250.

A UDP input is one of the defined logic values of 0, 1, X, (01), (0X), (10), (1X), (X0), and (X1). X indicates a UNKNOWN value. (01) represents a logic change from a zero to a one. (0X) represents a logic change from a zero to a UNKNOWN. (10) represents a logic change from a one to a zero. (1X) represents a logic change from a one to a UNKNOWN. (X0) represents a logic change from a UNKNOWN to zero. (X1) represents a logic change from UNKNOWN to one. The UDP output is one of three logic values: 0, 1, and X. One UDP output value is defined for each of the permutations of the UDP inputs 312.

The UDP computer model 302 does not support complex synchronization events, such as a gated clock input or simultaneous input changes. For example, if a simulation of the UDP computer model 302 causes two inputs of the UDP inputs 312 to change at exactly the same simulation time, the resulting evaluation is non-deterministic. This restricts the usefulness of the UDP computer model 302 because not all types of circuits represented by FSM 200 can be modeled.

An improvement over the UDP computer model 302 is the Fully Programmable Simulation Model (FPSM) computer model 303, available from Synopsys Inc., of Mountain View, Calif. An FPSM is not necessarily predefined by the user or the simulator. Each instance of an FPSM can be defined as a program uses the model by giving each instance an arbitrary logical function with an arbitrary number of inputs. Like a UDP, each FPSM has only a single output. However, one instance of an FPSM can replace many smaller UDPs, therefore a simulation using FPSMs runs much more efficiently. However, like the UDPs, an FPSM network 343 is required to model FSM 200 where FSM 200 has more than two states.

The FPSM computer model 303 made several advancements over the UDP computer model 302. The FPSM inputs 313 are identified as either edge-sensitive or level-sensitive. An FPSM input value of X is implicitly derived from the description of the FPSM network 343. An edge-sensitive input is translated to a 1 if triggered, a 0 if not triggered, and an X if UNKNOWN. A simulation program evaluates a UNKNOWN input first as if the input value is a 0 and then again as if the input value is a 1. The FPSM output is UNKNOWN if these determined output values for the X FPSM input are not equal. Otherwise, the FPSM output value is the "equal" output value. As a result, the FPSM inputs 313 need to be defined for logic values of 0 and 1. This reduced input logic set greatly simplifies the FSM computer model, reduces required memory, and improves the performance of programs that manipulate the FPSM.

The output of an FPSM can have one of the logic values from the set of logic values (0, 1, X, and N). N signifies that the output has NO CHANGE. In other words, N means that the output value has not changed since the last synchronizing event.

An FPSM, and therefore the FPSM network 343, however, is limited in that it cannot accept simultaneous input changes and cannot accurately model complex synchronized inputs. For example, an FPSM cannot accurately model FSM 200 where FSM 200 has a gated clock input.

Returning to the types of programs that uses these models, simulation programs use all the computer models discussed above. However, synthesis programs primarily use basic netlist computer models such as the UDP computer model. It is therefore desirable to have one computer model that can be used by simulation, synthesis and optimization programs.

What is needed is an improved computer model of an FSM that is accurate, compact, flexible, relatively easy to specify, and efficient. Such a computer model should support simultaneous inputs (also known as simultaneous input changes) and complex synchronized inputs.

SUMMARY OF THE INVENTION

An improved computer model of a finite state machine is described. A computer system having a computer model of a Finite State Machine (FSM). The computer system includes a processor coupled to receive and manipulate the computer model, and a memory. The memory includes a computer model. The computer model includes: a first set of inputs, a first set of delayed inputs, a first set of outputs and a first set of delayed outputs. The computer model has a first output of the first set of outputs corresponding to a first input of the first set of inputs, a first delayed input of the first set of inputs and a first delayed output of the first set of delayed outputs.

Although a great deal of detail has been included in the description and figures, the invention is defined by the scope of the claims. Only limitations found in those claims apply to the invention.

BRIEF DESCRIPTION OF THE DRAWINGS

The present invention is illustrated by way of example, and not limitation, in the figures. Like references indicate similar elements.

DESCRIPTION OF EMBODIMENTS OF THE INVENTION

OVERVIEW OF ONE EMBODIMENT OF THE PRESENT INVENTION

An improved computer model of a finite state machine is described. In the following description, specific details are set forth such as computer model inputs and outputs, etc., in order to provide a thorough understanding of the present invention. In other instances, known circuits, structures and techniques have not been shown in detail in order not to obscure the present invention.

One embodiment of the invention includes a delay computer model of a circuit that implements a finite state machine (FSM). The delay computer model is called a delay computer model because the outputs are defined not only by the inputs but also the delayed values of the inputs and the outputs. The delayed inputs and delayed outputs allow the delay computer model to represent simultaneous input changes, for example.

In one embodiment, a delay computer model is represented as a table. Each row in the table describes a state in the FSM. Each column represents a signal of the circuit that implements the FSM.

In one embodiment, a delay computer model is used to simulate a circuit that implements the FSM. In one embodiment, an output is determined by performing a look-up into a table using values for the inputs, the delayed inputs, and the delayed outputs.

In one embodiment, a delay computer model is used in synthesis and optimization. In one embodiment, a portion of a circuit representing the FSM can be synthesized and optimized from the delay computer model. In one embodiment, rules are applied to the delay computer model inputs to determine the type of signal represented by each input. In one embodiment, an output value of N is important in determining the type of signal represented by an input. N indicates NOT ACTIVE, meaning that for a given set of inputs, the output is not active. By determining the types of signals represented, like represented signals can be grouped. Grouped represented signals can be analyzed to determine possible combinational logic circuits. In one embodiment, outputs and corresponding type identified signals can then be used to determine a network of primitive models that represent the FSM.

COMPUTER SYSTEM INCLUDING A COMPUTER MODEL

Figure 1:
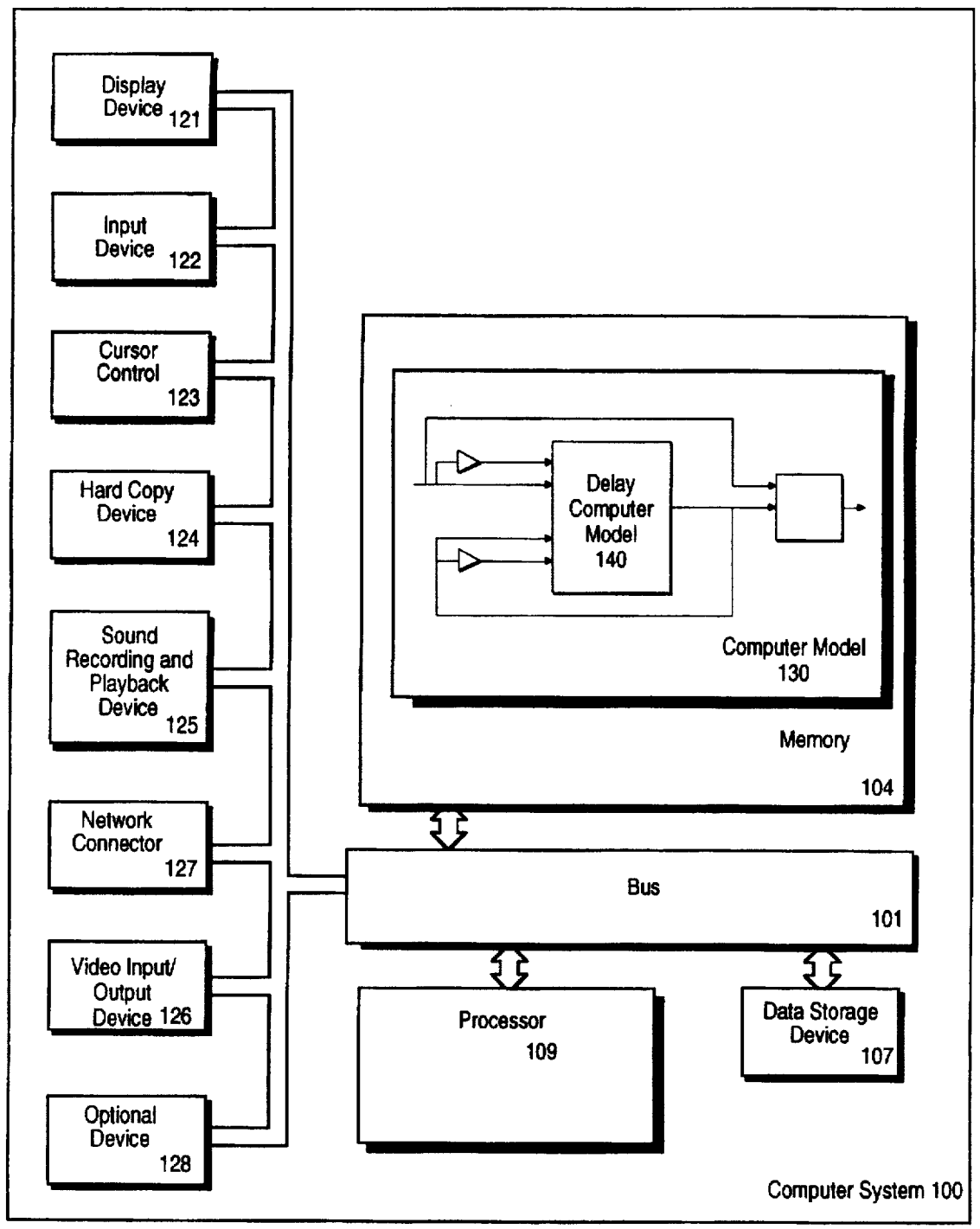
FIG. 1 illustrates a computer system including a computer model of an Finite State Machine (FSM).
Figure 2:
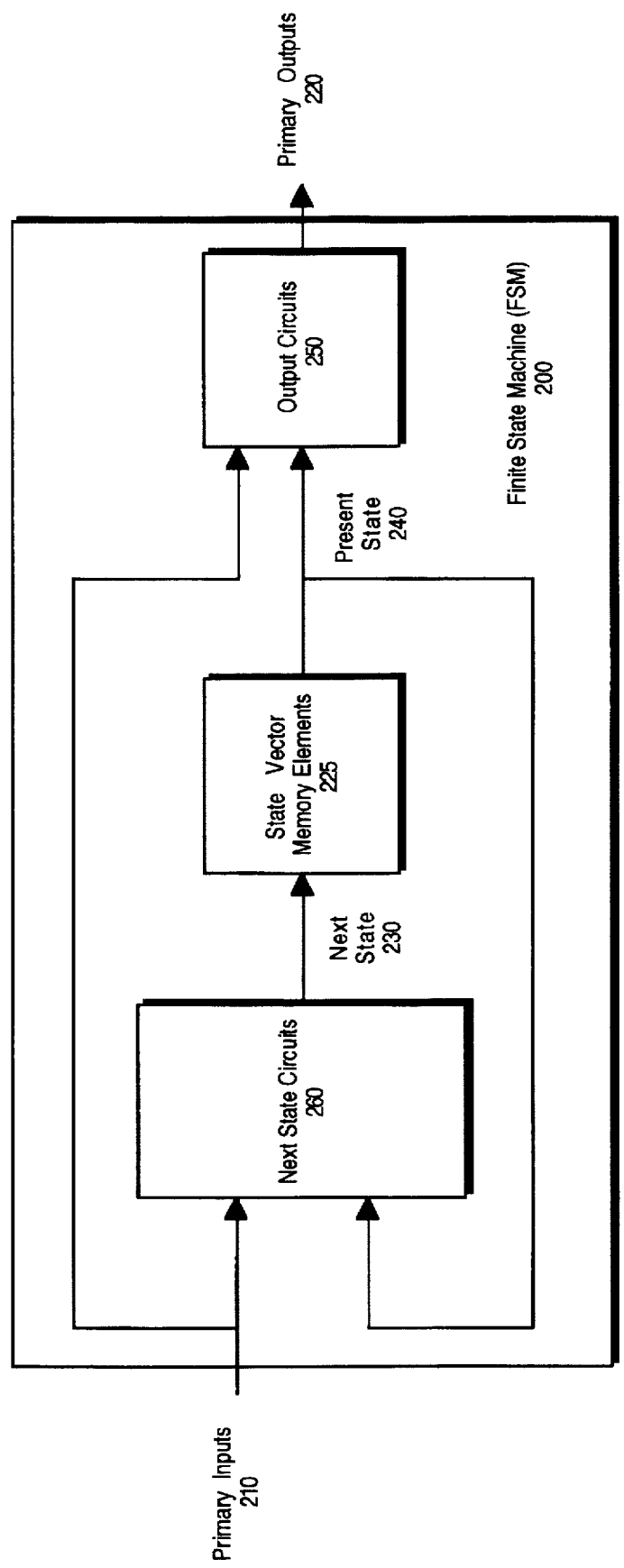
FIG. 2 illustrates an FSM.
Figure 3:
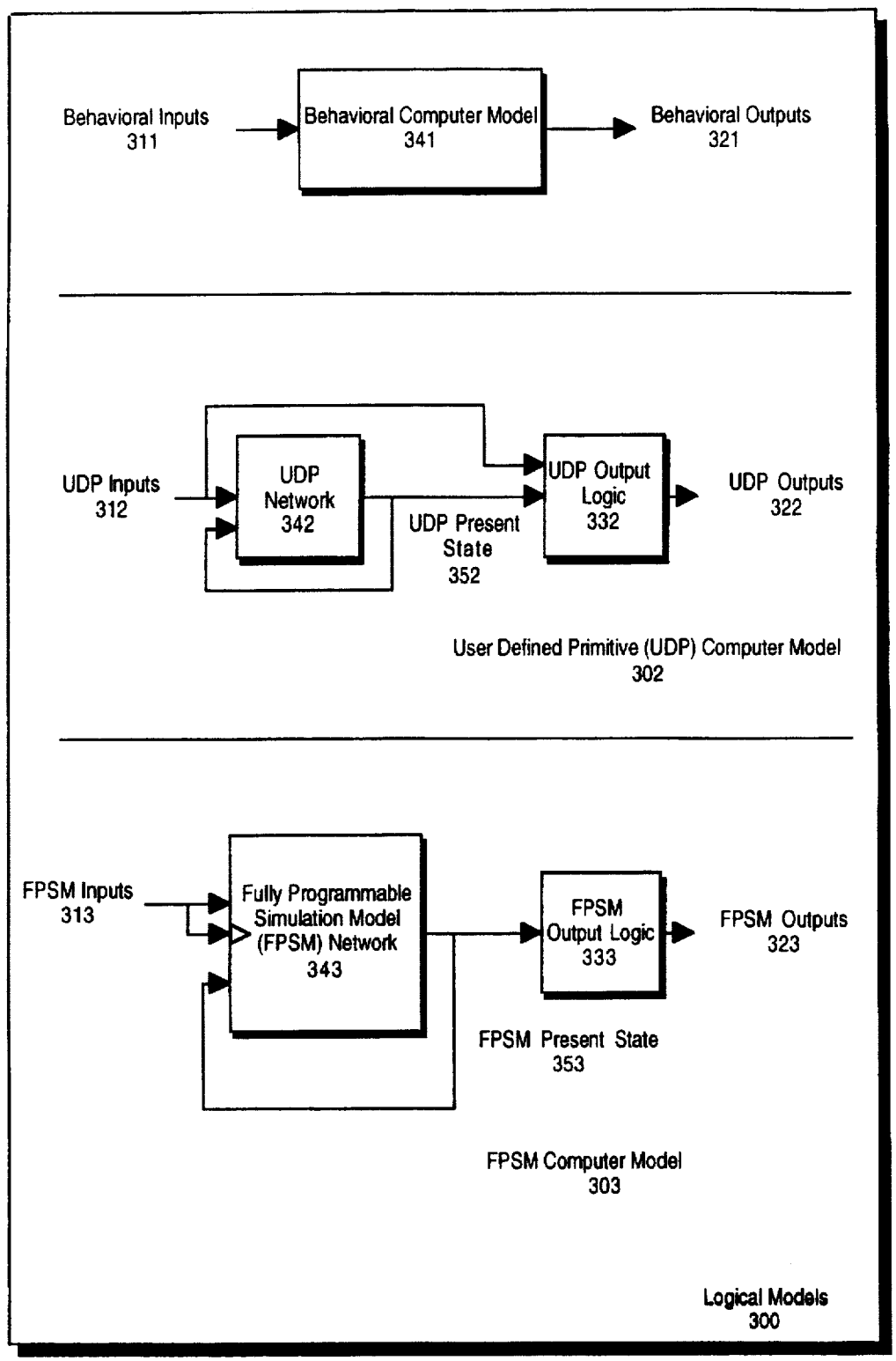
FIG. 3 illustrates a number of prior art computer models of FSMs.

FIG. 1 illustrates a computer system 100 upon which an embodiment of the present invention can be implemented. Computer system 100 includes a bus 101, or other communications hardware and software, for communicating information, and a processor 109 coupled with bus 101 for processing information. Processor 109 can be a single processor or a number of individual processors that can work together. Computer system 100 further includes a memory 104. Memory 104 can be random access memory (RAM), read only memory (ROM), or some other data storage device. Memory 104 is coupled to bus 101 and is for storing information and instructions to be executed by processor 109. Memory 104 also may be used for storing temporary variables or other intermediate information during execution of instructions by processor 109. Computer system 100 includes a computer model 130. The computer model 130 includes an finite state machine (FSM) model, delay computer model 140. Processor 109 can access and manipulate computer model 130.

Computer system 100 can also include a display device 121 for displaying information to a computer user. Display device 121 can be coupled to bus 101. Display device 121 can include a frame buffer, specialized graphics rendering devices, a cathode ray tube (CRT), and/or a flat panel display. Bus 101 can include a separate bus just for display device 121.

An input device 122, including alphanumeric and other keys, is typically coupled to bus 101 for communicating information such as command selections to processor 109 from a user. Another type of user input device is cursor control 123, such as a mouse, a trackball, a pen, a touch screen, a touch pad, a digital tablet, or cursor direction keys for communicating direction information to processor 109, and for controlling cursor movement on display device 121. This input device typically has two degrees of freedom in two axes, a first axis (e.g., x) and a second axis (e.g., y), which allows the device to specify positions in a plane. However, this computer system is not limited to input devices with only two degrees of freedom.

Another device which may be optionally coupled to bus 101 is a hard copy device 124 which may be used for printing insauctions, data, or other information on a medium such as paper, film, slides, or other types of media.

A sound recording and/or playback device 125 can optionally be coupled to bus 101. For example, sound recording and/or playback device 125 can include an audio digitizer coupled to a microphone for recording sounds. Further, sound recording and/or playback device 125 may include speakers which are coupled to a digital to analog (D/A) converter for playing back sounds.

A video input/output device 126 can optionally be coupled to bus 101. This video input/output device 126 can be used to digitize video images from, for example, a TV, a VCR, and/or a video camera. Video input/output device 126 can include a scanner for scanning printed images.

Also, computer system 100 can be part of a computer network (e.g., a LAN) using the optional network connector 127 being coupled to bus 101. In one embodiment of the present invention, the entire network can then also be considered to be part of computer system 100.

Optional device 128 can optionally be coupled to bus 101. Optional device 128 can include, for example, a PCMCIA card adapter. The optional device 128 can further include an optional device such as modem or a wireless network connection.

A DELAY COMPUTER MODEL

Figure 4:
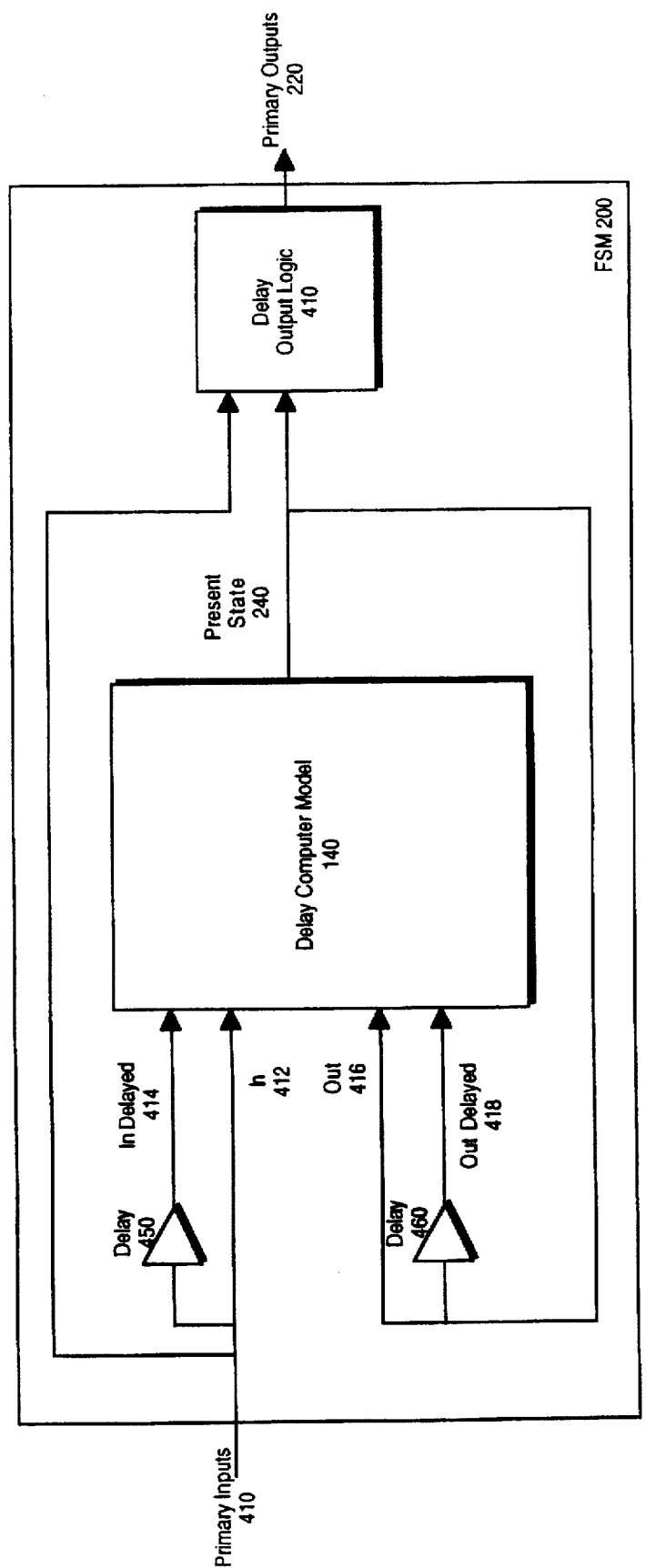
FIG. 4 illustrates one embodiment of a delay computer model that can be stored and manipulated in a computer system.

FIG. 4 illustrates a delay computer model as may be used in one embodiment of the present invention. This delay computer model 140 is called a delay computer model because it supports normal inputs and inputs that are delayed. This is explained in greater detail below.

Delay computer model 140 is the core of a new computer model of FSM 200. Delay computer model 140 models the next state circuits 260 and the state vector memory elements 225. The primary inputs 210 are defined for delay computer model 140 as in 412 and in delayed 414. The present state 240 is fed back into the delay computer model 140 through out delayed 418. Delay output logic 410 can be a model of a combinational logic circuit. Delay 450 and delay 460 are merely illustrative of a delay between in 412 and in delayed 414, and the present state 240 and the out delayed 418. For the purposes of the delay computer model 140, in 412, in delayed 414, out delayed 418 can be thought of as inputs to the delay computer model 140.

In one embodiment, in 412 can be a set of inputs. These inputs are logical representations of input signals for a circuit. For example, a set of inputs can be logical representations of the reset signal and clock signal for a circuit. Each input can have a logical value. In one embodiment, the values of the inputs are from the set of values {0, 1 }. In another embodiment, the values of the inputs are from the set of values {0, 1, X}. In another embodiment, the values of the inputs are from the set of values {0, 1, X, N}. In delayed 414 can be a subset of the set of inputs for in 412. That is, for every input there need not be a corresponding delayed input. The delayed inputs (represented by in delayed 414) are logical representations of corresponding inputs.

In one embodiment, the set of output values representing the present state 240 can be from the same sets of values as the input values. Further out delayed 418 can be a subset of the set of output values for the present state 240. That is, for every output in the present state 240 there need not be a corresponding delayed output.

Delay computer model 140 defines relationship between a state of FSM 200 and the values of in 412, in delayed 414, out delayed 418 and the present state 240. From these relationships, a simulation program can simulate FSM 200, even when the FSM 200 has more than two states. Further, a synthesis or optimization program can synthesize or optimize a circuit that corresponds to FSM 200. For each relationship of in 412, in delayed 414 out delayed 418, a corresponding present state 240 is included in the delay computer model 140.

In one embodiment of the invention, a delay computer model 140 of an FSM is accurate, compact, flexible, relatively easy to specify, and efficient. A delay computer model 140 defines a relationship between input, delayed input, and delayed output values and corresponding output values. The delay computer model 140 is accurate because it can represent simultaneous input changes and complex synchronized inputs through the use of values and delayed values. The delay computer model 140 is relatively compact because it can represent multiple memory elements and complex FSMs using a single set of relationships. The delay computer model 140 is flexible and relatively easy to specify because a user can define and modify the computer model 130 of the entire FSM by changing the values of the inputs, delayed inputs, and the delayed outputs. To define and modify a UDP computer model 302 or a FPSM computer model 303, the user may have to modify the interconnection of primitive models or the definition of the primitive models themselves. The delay computer model 140 is efficient because it can specify the entire FSM as opposed to having to define parts of the FSM. Further, the delay computer model 140 also benefits in that it can be used for simulation, synthesis and optimization.

Typically, a delay computer model 140 is stored in the memory 104 as a table (Table 2 is one example of such a table). To determine the next state of FSM 200, a look up is made into the table using the values of in 412, in delayed 414 and out delayed 418, as the index to the table. The accessed table entry defines the values representing the present state 240. Of course other types of data structures, such as linked lists and ordered collections, could be used to store and allow manipulation of delay computer model 140. In the case of the table, each row of the table corresponds to a state. Each column of the table corresponds to a set of input values for an input to the delay computer model 140.

In one embodiment, a user can defined the relationships in a delay computer model 140 by entering values into a table (Table 2 is one example of such a table) using a graphical user interface program. The table can be stored in memory 104 by processor 109.

In one embodiment, the processor 109, using a program, will optimize the storage of the entered table before finally storing the table in memory 104. The processor 109 will effectively remove any inputs that are functionally unrelated to any of the outputs. That is, the processor 109 will determine for a given input that it does not effect any of the outputs and thereby remove that input from the table.

An important aspect of one embodiment of the invention is the existence of in delayed 414 and out delayed 418. The delayed values allow a user to distinguish between edge triggered inputs and level triggered inputs for the FSM 200. The delayed values can model simultaneous input changes to the FSM 200. The delayed values can also model gated, edge triggered, inputs.

Another important aspect of one embodiment of the invention is the use of N as a possible output value. N indicates that the output is NOT ACTIVE for the given set of inputs. N can be used in simulation to provide a more accurate simulation of an FSM than when N is not available as an output. Note that NOT ACTIVE, for some circumstances, is different than NO CHANGE. For simulation, NOT ACTIVE essentially means NO CHANGE. However, for synthesis the distinction becomes important. N (NOT ACTIVE) is important in synthesis and optimization so that circuits can be determined and optimized from the modeled FSM.

Figure 5:
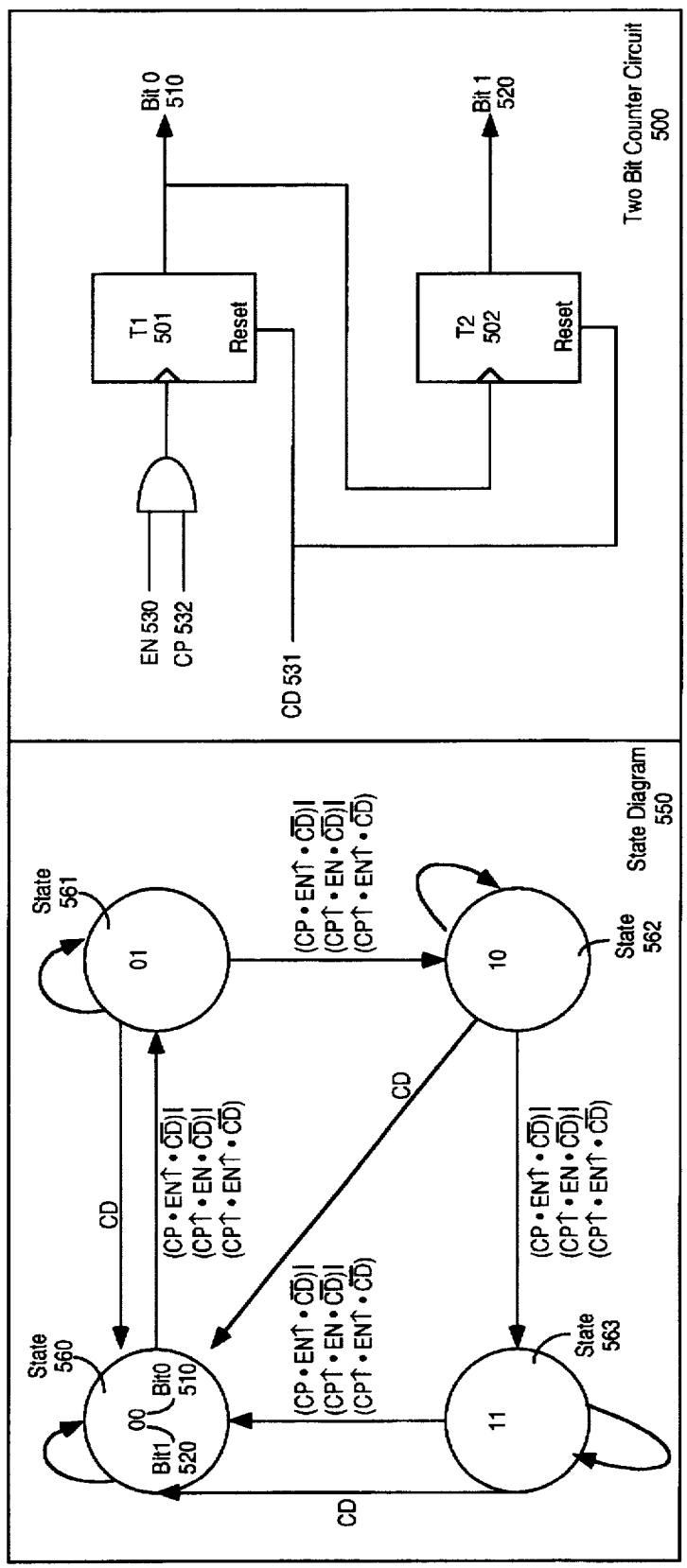
FIG. 5 illustrates a counter circuit and a corresponding state machine.

FIG. 5 illustrates an example state diagram 550 that represents an example FSM for a two bit counter. The counter has a reset (CD 531), an enable 530, a clock CP 532, and two outputs bit1 520 and bit0 510. State diagram 550 includes four states: state 560 represented by 00 (bit1 520 and bit0 510), state 561 represented by 01, state 562 represented by 10 and state 563 being represented by 11. A state transition, e.g. from state 561 to state 562 (10 to 11), occurs when the CP 532 rises, EN 530 is high and CD 531 is low. A state transition also occurs when CP 532 is high, EN 530 rises and CD 531 is low. A state transition also occurs when CP 532 rises, EN 530 rises, and CD 531 is low. A state transition corresponds to the counter counting by one. If, at any state, CD 531 is high, then the next state is state 560 (reset to 00). For all other inputs, the next state is the present state.

FIG. 5 also illustrates a netlist computer model of a two bit counter circuit 500 and a state diagram 550 for the FSM of state diagram 550. T flip-flop 501 has an enable signal EN 530 ANDed with clock signal CP 532 coupled to the T flip flop 501's trigger. The output of T flip-flop 501 is bit0 510. The output of T flip-flop 501 is coupled to the trigger for T flip-flop 502. The output of T flip-flop 502 is bit1 520. A reset CD 531 is coupled to both T flip-flop 501 and T flip-flop 502.

The following represents a UDP computer model 302 of the FSM for the two bit counter circuit 500. Essentially, the UDP computer model 302 of the example FSM is a textual description of the devices in the two bit counter circuit 500. However, UDP primitives are used to define the flip-flops. Note that the UDP computer model includes three primitive models: AND, TFF1 and TFF2. Each primitive model describes only one device in the two bit counter circuit 500.

```
UDP Network( EN, CP, CD, BIT1, BIT0)
{
AND( EN, CP, ENCP);
TFF1(ENCP, CD, BIT0);
TFF2(BIT0, CD, BIT1);
}
``` where the definition of a TFF is defined in Table 1. Trigger is the synchronous toggle input signal for the flip-flop. CD is the reset signal for the flip-flop. Q_LAST is the last value of the output signal. Q is the value of the output given the values of trigger, CD and Q_LAST. A dash ('—') indicates all possible values not otherwise explicitly defined. Columns to the left of the double line are inputs. Columns to the right of the double line are outputs. Note that for UDPs primitive models and FPSMs primitive models, only one output column is allowed.

TABLE 1

| Trigger | CD | O LAST | O |
|---------|----|----|----|
| — | 1 | — | 0 |
| — | 0 | — | 0 |

TABLE 1-continued

| Trigger | CD | O LAST | O |
|---------|----|----|----|
| (01) | 0 | 0 | 1 |
| (01) | 0 | 1 | 0 |

An FPSM computer model 303 of the circuit is not possible because FPSM does not support a gated synchronizing signal such as occurs when both CP 532 and EN 530 rise simultaneously.

The following pseudocode represents a delay computer model 140 of the FSM represented by the state diagram 550. The in 412 set of inputs includes CD, EN, and CP. The in delayed 414 set of delayed inputs includes CD_DELAY, EN_DELAY, and CP_DELAY. The out delayed 418 set of delayed outputs includes Bit1_DELAY, and Bit0_DELAY. The present state 240 set of outputs includes Bit1 520 and Bit0 510. In one embodiment, the delayed inputs allow the delay computer model 140 to model synchronized inputs, simultaneous inputs, and complex synchronized inputs. g0() represents relationships between the inputs (CD, CD_DELAY, EN, EN_DELAY, CP, CP_DELAY, Bit1_DELAY, Bit0_DELAY) and the output Bit0. Similarly, g1() represents relationships between the inputs and the output Bit1. These relationships are shown in more detail below.

```
Variable NewFSM( CD, CD_DELAY, EN, EN_DELAY, CP,
CP_DELAY,
    Bit1_DELAY, Bit0_DELAY, Bit1, Bit0)
{
    Bit0 := g0(CD, CD_DELAY, EN, EN_DELAY, CP,
              CP_DELAY, Bit1_DELAY, Bit0_DELAY);
    Bit1 := g1(CD, CD_DELAY, EN, EN_DELAY, CP,
              CP_DELAY, Bit1_DELAY, Bit0_DELAY);
}
```

Another pseudocode representation of a delay computer model 140 of the FSM represented by the state diagram 550 is presented below. Note that because no outputs depend upon CD_DELAY or Bit1_DELAY, CD_DELAY and Bit1_DELAY are not part of the in delayed 414 set of delayed inputs or the out delayed 418 set of outputs respectively. In this example, the delayed values are derived from the non-delayed values.

```
Variable NewFSM( CD, EN, CP, Bit1, Bit0)
    local variables EN_DELAY, CP_DELAY, Bit0_DELAY;
{
    Bit0 := f0( CD, EN, EN_DELAY, CP, CP_DELAY,
               Bit0_DELAY);
    Bit1 := f1( CD, EN, EN_DELAY, CP, CP_DELAY,
               Bit0_DELAY);
    EN_DELAY := EN;
    CP_DELAY := CP;
    Bit0_DELAY := Bit0;
}
``` where the relationship of f0() and f1() to CD, EN, EN_DELAY, CP, CP_DELAY, and Bit0_DELAY is defined in Table 2. For example, for row one of Table 2, f1()=0 when Bit0_DELAY=0, and f1()=0 when Bit0_DELAY=1. Again a dash ('—') in the table indicates that output value (e.g. f1() or f0()) is the same if the input value is 1 or 0. Thus, a row in Table 2 can represent multiple states of a states of an FSM. That is, a row in Table 2 can represent multiple relationships between the inputs and the outputs for a delay computer model 140. For example row four represents the relationships: CD=0, EN=1, EN_DELAY=0, CP=1, CP_DELAY=0, Bit0_DELAY=0, Bit1=0, and Bit0=1; and CD=0, EN=1, EN_DELAY=1, CP=1, CP_DELAY=0, Bit0_DELAY=0, Bit1=0, and Bit0=1.

TABLE 2

| Row# | CD | EN | EN DEL AY | CP | CP DEL AY | Bit0 DE LAY | f1O Bit1 | f0O Bit0 |
|------|----|----|-----------|----|-----------|-------------|----------|----------|
| 1 | 1 | — | — | — | — | — | 0 | 0 |
| 2 | 0 | — | — | 0 | — | — | N | N |
| 3 | 0 | 0 | — | — | — | — | N | N |
| 4 | 0 | 1 | — | 1 | 0 | 0 | 0 | 1 |
| 5 | 0 | 1 | — | 1 | 0 | 1 | 1 | 0 |
| 6 | 0 | 1 | — | 1 | 0 | 0 | 1 | 1 |
| 7 | 0 | 1 | — | 1 | 0 | 1 | 1 | 1 |
| 8 | 0 | 1 | 0 | 1 | — | 0 | 0 | 1 |
| 9 | 0 | 1 | 0 | 1 | — | 1 | 1 | 0 |
| 10 | 0 | 1 | 0 | 1 | — | 0 | 1 | 1 |
| 11 | 0 | 1 | 0 | 1 | — | 1 | 0 | 0 |

As mentioned previously, a program may optimize the storage of a table holding the relationships for a delay computer model 140. For example, if g0() included values for Bit1_DELAY, the processor 109 will determine that no outputs depend upon Bit1_DELAY and therefore this column can be ignored or discarded. Thus, memory is saved and the delay computer model 140 can be accessed from memory 104 more quickly.

From the above example, we note a number of important distinctions between the UDP computer model 302 and the delay computer model 140. The UDP user is required to interconnect a number of primitive models together to model the circuit. Thus, the UDP computer model 302 does not provide the user with as high a level of abstraction as the delay computer model 140. For example, a UDP user defines the use of an AND primitive model for the trigger. However, from the perspective of the state diagram 550, all that is important is that state transitions occur when EN 530 is high, CP 532 rises, and CD 531 is low, or when EN 530 rises, CP 532 is high, and CD 531 is low, or when EN 530 rises, CP 532 rises, and CD 531 is low. ANDing EN 530 and CP 532 together is but one possible circuit for achieving this result. For example, EN 530 and CP 532 can be NANDed together and then inverted, or some other circuitry could be used. Similarly, the UDP computer model example dictates the use of a T flip-flop. However, combinations of other types of flip-flops and combinational logic not represented by the UDP computer model can be used to implement the state diagram 550.

SIMULATION WITH A DELAY COMPUTER MODEL

A simulation program can use a delay computer model 140 to simulate the operation of a circuit that implements FSM 200. Such a simulation program can be executed in processor 109 using memory 104 to store at least a portion of the simulation program.

Figure 6:
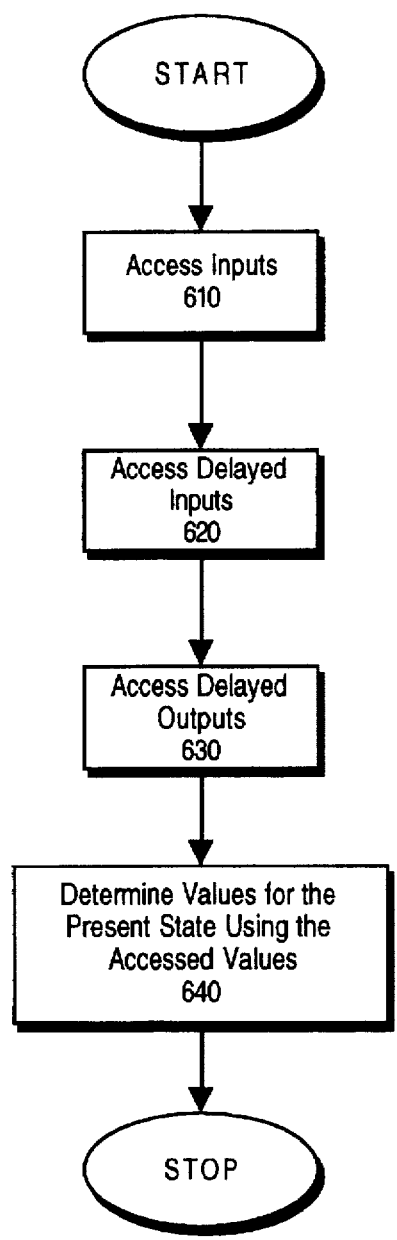
FIG. 6 illustrates one embodiment of a method of simulating a circuit representing an FSM by using a delay computer model.

FIG. 6 illustrates one embodiment of simulation using the delay computer model 140. The order of the steps presented is illustrative and not necessarily required. For example step 620 can be performed before step 610 or in parallel with step 630. Including a Verilog implementation of the above described pseudocode for a delay computer model 140 as input to a simulation program, allows for simulation with the delay computer model 140. The inputs to the simulation program will typically include a series of values for in 412 and in delayed 414. The outputs from the simulation typically include the values of the corresponding primary outputs 220 and values corresponding to the present state 240.

At step 610, the processor 109 accesses a set of input values for in 412. Typically, this is in response to the simulation program needing to determine the result of some inputs to the delay computer model 140.

At step 620, the processor accesses a set of input values for in delayed 414. In one embodiment, these values can be the values for the inputs for in 412 at the last synchronizing event (a synchronizing event can be a clock rise for example). In another embodiment, these values can be expressly provided for the simulation.

At step 630, the processor accesses a set of output values for out delayed 418. In one embodiment, these values can be the results of the last simulated state. Note however, that in one embodiment, if the output is N, then the delayed value does not change. For example if Bit0 equals N when Bit0__DELAY equals 1, then Bit0__DELAY for the next synchronizing event will remain 1.

At step 640, the processor accesses the delay computer model 140 from memory 104. Typically, this involves the processor performing a look-up into a table in the memory 104 using the values accessed in step 610 through step 630. The results of the look up define the present state 240. These results are supplied to the simulation program as the simulated result of the operation of a circuit representing a finite state machine.

Note that for a UDP computer model 302, the intermediate results from one primitive would have to be propagated to the next primitive by the simulation program. One embodiment of the invention improves on the UDP computer model in that these intermediate outputs do not have to be generated or propagated, thereby reducing the need for computer time and memory.

Table 3 illustrates example input data and output results for a simulation using delay computer model 140 of an FSM represented by state diagram 550. The input data define the input signals and their values at various times. For example, at time 140, CP is one, EN is one, and CD is one. The output results define the input signals and the output signals Bit__1 and Bit__0. Note that for this example simulation, the values of CP__DELAY, EN__DELAY and Bit0__Delay are derived and held with the delay computer model 140. See for example the second example of pseudocode for the delay computer model 140 for the FSM represented by the state diagram 550 above.

TABLE 3

| Input File | Output Result File |
|---|---|
| CP; | CP; |
| EN; | EN; |
| CD; | CD; |
|  | Bit__1, |
|  | Bit__0; |
| 100 010 | 100 010 00 |
| 110 110 | 110 110 00 |
| 120 111 | 120 111 01 |
| 130 110 | 130 110 01 |
| 140 111 | 140 111 10 |

SYNTHESIS AND OPTIMIZATION WITH A DELAY COMPUTER MODEL

Figure 7:
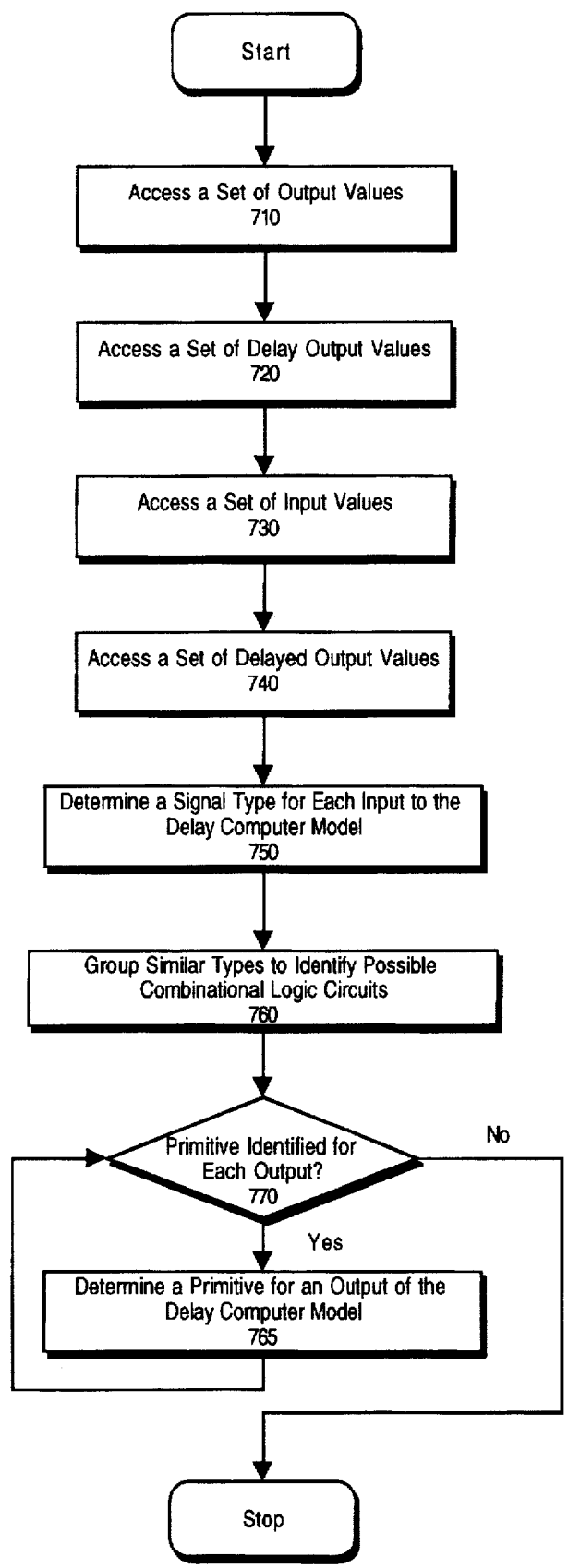
FIG. 7 illustrates one embodiment of a method of synthesizing a portion of a circuit representing an FSM by using a delay computer model.

A synthesis program can use a delay computer model 140 to synthesize a portion of a circuit that implements FSM 200. Such a synthesis program can be executed in processor 109 using memory 104 to store at least a portion of the synthesis program. FIG. 7 illustrates one embodiment of a method of synthesizing a portion of a circuit using the delay computer model 140. As with FIG. 6, the order of the steps of FIG. 7 are not necessarily required to be performed in the order illustrated.

An optimization program can use a delay computer model 140 to optimize a synthesized portion of a circuit that implements FSM 200. Such an optimization program can be executed in processor 109 using memory 104 to store at least a portion of the optimization program. As optimization benefits from the delay computer model 140 much in the same way that synthesis benefits, usually only where there are differences will the differences be discussed.

In brief, in one embodiment of the invention, a synthesis program examines of the various signals represented by values in the delay computer model. Keep in mind that the synthesis program does not know that, for example, CD represents a clear signal or that CP is a clock. The synthesis program identifies each type of signal represented by in 412, in delayed 414 and out delayed 418. Remember that in 412, in delayed 414 and out delayed 418 represent sets of signals for a circuit implementing FSM 200. Tests are made to determine various possible types of signals. For example, a signal may be identified as an asynchronous data signal or an asynchronous enable. These types of signals may then be grouped with each output signal in the present state 240.

In one embodiment of the invention, once the types of signals have been identified, a set of primitive models can be determined that implement the FSM 200. Typically, a database of primitive models, much like the primitive models used in the basic netlist computer model, is used. Then, a search is made in the database to determine a primitive model that has a particular output for a given set of inputs. If no database match is found, then the circuit cannot be completely synthesized. If a match can be found, then the matching primitive model is used as a portion of the synthesized circuit. This process continues for each of the signals represented by out the present state 240. The resulting combination of primitive models represents a circuit that implements the FSM 200.

Referring to FIG. 7, at step 710 the output values of the delay computer model 140 are accessed. For example, the values for Bit1 and Bit0 are accessed. In one embodiment, the processor 109 accesses the columns in a table that stores the values for these bits. In one embodiment, the values for a single output are accessed and processed at a time.

At step 720 the delay out 418 values are accessed. For example, the values for Bit1__DELAY and Bit0__DELAY are accessed.

At step 730 the in 412 values are accessed. For example, the values for CD, EN and CP are accessed.

At step 740 the delay in 414 values are accessed. For example, the values for EN__DELAY and CP__DELAY are accessed.

At step 750 a test is made to determine whether a signal type has been determine for each input to the delay computer model 140. That is, all the signals represented by in 412, in delayed 414, and out delayed 418, have a signal type identified for them. A signal type identifies the type of signal represented by an input to the delay computer model 140. In one embodiment, the following signal types can be determined: clock, asynchronous enable, synchronous data, asynchronous data, asynchronous clear and asynchronous preset. Other types of signal types can be identified such as a multiplexor select. One embodiment of an invention including rules for determining signal types is discussed in relation to FIG. 8.

In one embodiment of the invention, once the signal types are identified, the table representing the relationships of the delay computer model 140 may be broken into UDP or FPSM computer models. If it is not possible to break the table into UDP or FPSM computer models, then the table may be broken into a basic netlist of non-programmable primitive models.

Once all the signal types are identified, then at step 760, the common types of signals are grouped together for each output signal to determine if a combination logic circuit can be generated to represent this relationship. The relationship between these types of signals is then determined, if one exists at all. For example, the clock type signal CP and the clock type signal EN can be grouped. A relationship between the clock signal CP and another clock signal EN may be determined to be an AND relationship. The circuits synthesized for these relationships implement the next state circuits 260.

Next a primitive model is identified for each bit used to represent the present state 240. At step 770, a test is made to determine whether a primitive model has been identified for each signal represented by the present state 240. For example, the test of step 770 determines whether a primitive model is determined for the bit0 510 and another primitive model is determined for the bit1 520.

Step 775 is executed if not all of the primitive models for the present state 240 have been identified. In one embodiment, the types of input signals and the values representing the output signal are used to search a database of primitive models. If no match can be found, then that portion of the circuit cannot be synthesized using the present database. In one embodiment, a different database of primitive models can be searched, if no primitive model is identified, then that portion of the circuit implementing the FSM 200 cannot be synthesized. This may occur, for example, where the definition of the delay computer model 140 is invalid.

In one embodiment, a set of primitive models may be found at step 755 that match the requirements of the signal types and the output. In such cases, an optimization program can be used to select particular primitive models from the set of primitive models. The selection process can be performed using user defined criteria such as minimizing the die area used by the circuit or maximizing the speed of the circuit.

As mentioned previously, in another embodiment, UDP models or FPSM models can be generated from the delay computer model 140, instead or, or in addition to, determining models.

DETERMINING SIGNAL TYPES

Figure 8:
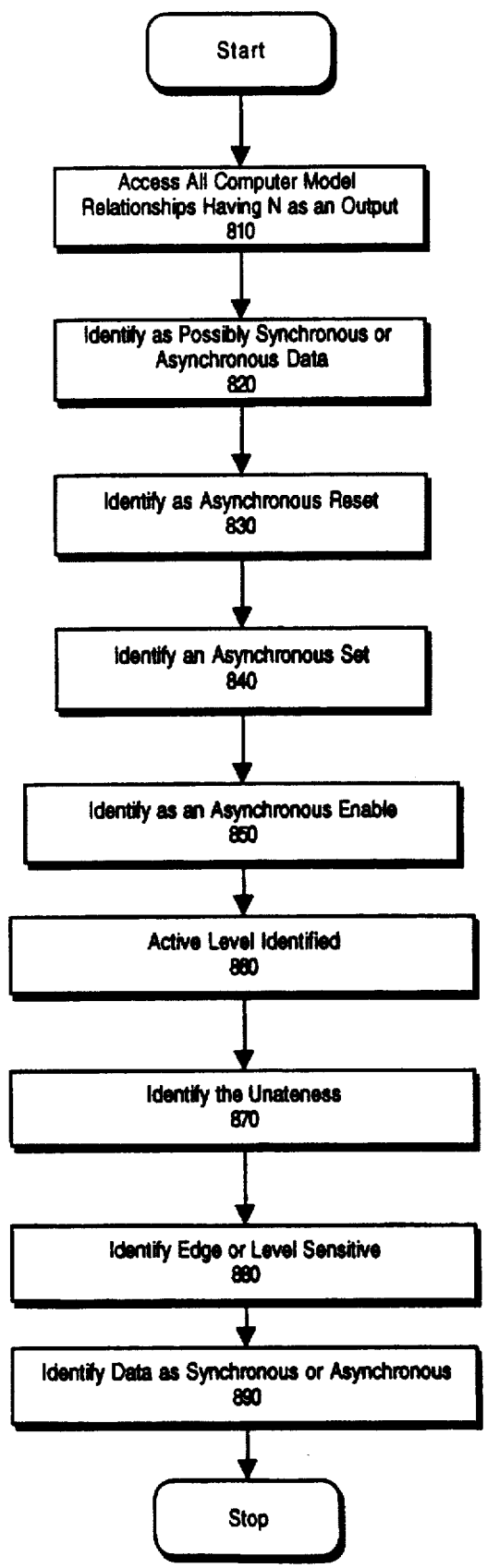
FIG. 8 illustrates one embodiment of determining signal types for a computer model.

FIG. 8 illustrates one embodiment of determining signal types for a computer model. As with FIG. 6, the order of the steps of FIG. 8 are not necessarily required to be performed in the order illustrated.

Signal types are determined for each output signal represented in present state 240. Such an embodiment can include a program that can execute on processor 109. The steps of FIG. 8 are repeated for each input signal represented by in 412, in delayed 414 and out delayed 418. For example, signal types for CD, EN, EN_DELAY, CP, CP_DELAY, Bit0_DELAY are determined for each output Bit1 and Bit0.

An important discovery that enables the signal types to be identified is that asynchronous inputs are inactive when the output is N. Therefore, at step 810, all relationships resulting in N for the given input are accessed. For example, if the output of interest is Bit0 then the relationships represented in rows two and three of Table 2 are accessed.

At step 820, for each relationship resulting in N, if the output is N when the given input is one, zero, or unknown (X), then the signal type is initially classified as synchronous data or asynchronous data. For example, when determining signal types for Bit1, for both relationships of row two and row three, changing the value of Bit0_DELAY to zero, one or unknown, does not affect the output Bit0. Therefore, Bit0_DELAY is initially identified as a synchronous data or an asynchronous data signal.

At step 830, for each relationship resulting in N, if the output is zero or N when the given input is one, zero, or unknown, then the signal type is defined as an asynchronous reset. For example, for row two and row three, when CD is toggled, Bit0 becomes a one. Therefore, CD is initially identified as an asynchronous reset signal.

Similarly, at step 840, for each relationship resulting in N, if the output is one or N when the given input is one, zero, or unknown, then the signal type is initially identified as an asynchronous set.

At step 850, if the signal has not been identified in step 820 through step 840, then the signal is initially identified as an asynchronous enable.

At step 860, the active level (high-1 or low-0) of the signal is identified. The relationships having an active (non-N) output value are accessed. The active level of the signal is identified as the value of the input when the input value is consistent for the non-N output values. For example, for row two, whenever CD is a one, Bit0 is consistently a non-N value. Therefore, the active level of CD is one. However, when CD is zero, Bit0 may be N, zero or one. The active level can also be determined to be unknown.

At step 870, the unateness of an input is determined. The unateness of a signal defines how the output follows the input. Positive unateness means that the output rises or does not change if the input rises. Negative unateness means that the output falls or does not change if the input rises. Unknown unateness can also be determined. At step 870, the unateness of each input is determined by examining input permutations and checking the output result. Note that the initially identified signal type can be used to determine the unateness. For example, when determining signal types for Bit1, Bit0_DELAY is determined to be positively unate by comparing the permutations having Bit0_DELAY with the values of Bit1. The unateness of the signal can be used during synthesis to find a primitive model that can be used to implement a portion of the circuit representing the FSM 200. The unateness of the signals can be used during optimization to select a primitive model from a number of primitive models that can be used to implement a portion of the circuit representing the FSM 200.

At step 880, the relationship between various input signals can be used to determine whether the input signal type is edge sensitive or level sensitive. That is, the relationship between signals represented by in 412 and in delayed 414 are used. For example, EN_DELAY is the delayed value of EN. Transitions (e.g. 0–>1, or 1–>0) between related signals are examined to determine whether they affect the output. In this way, clock signals can be identified from edge sensitive asynchronous enables. For example, EN, EN_DELAY, CP, and CP_DELAY are determined to be clocks for Bit0. For one embodiment of the invention, the edge sensitive or level sensitive nature of a signal is determined for inputs and delayed inputs but not delayed outputs. In one embodiment, the edge sensitive or level sensitive nature of a signal is determined for delayed outputs by examining the corresponding output.

At step 890, whether an initially identified synchronous or synchronous data signal type is synchronous or asynchronous is determined. Relationships having a clock edge are ignored. This is because asynchronous data should not require an input edge for the output to change. Therefore, if the output does not change between different values of a data type signal, then the data is determined to be synchronous data. For example, for the case of Bit1, all the relationships of Table 2 are ignored except where EN, EN_DELAY are both ones or zeros, and CP and CP_DELAY are both ones or zeros (represented in row 1 of Table 2). Bit0_DELAY is therefore determined to be synchronous data because the value of Bit1 does not change for the relationships represented by row 1.

For the case of an optimization program using computer model 140, once the network of primitive models has been defined, in one embodiment, known optimization routines can be used to optimize the circuit representing the FSM 200.

An improved computer model of a finite state machine has been described.

What is claimed is:

1. A computer system having a computer model of a Finite State Machine (FSM), said computer system comprising:
   a processor coupled to receive and manipulate said computer model; and
   a memory including said computer model, said computer model having been compiled by a compiler from a textual description of the computer model, said computer model including,
   a first set of inputs and a first set of delayed inputs, and
   a first set of outputs and a first set of delayed outputs, wherein
   said computer model having a first output of said first set of outputs corresponding to a first input of said first set of inputs, a first delayed input of said first set of inputs and a first delayed output of said first set of delayed outputs, said first output being provided in response to a simulation program executing on said computer system.

2. The computer system of claim 1 wherein said first set of outputs includes values from a first set of values including {Zero, One, X, N }, where X indicates UNKNOWN and N indicates NOT ACTIVE.

3. The computer system of claim 1 wherein said first set of inputs includes values from a second set of values including {Zero, One}.

4. The computer system of claim 3 wherein said second set of values includes {X}, where X indicates UNKNOWN.

5. The computer system of claim 1 wherein a state of said FSM is defined by said first input, said first delayed input, said first output, and said first delayed output.

6. The computer system of claim 5 wherein said state is defined by a state vector and wherein said memory includes said state vector, and wherein said state vector is stored as a row in a table in said memory, said table storing a plurality of relationships between states of said FSM and said first set of inputs, said first set of delayed inputs, said first set of outputs and said first set of delayed outputs.

7. A method of simulating a circuit on a computer system, said circuit including a computer model of a Finite State Machine (FSM), said computer system including a processor and a memory, said processor being coupled to said memory, said method comprising:
   accessing a textual description of said computer model;
   compiling said textual description of said computer model into a compiled computer model;
   storing said compiled computer model in said memory;
   accessing said compiled computer model;
   accessing a first input value;
   accessing a first delayed input value;
   accessing a first delayed output value; and
   executing a simulation program on said processor causing said processor to access a first output value from said computer model using said first input value, said first delayed input value and said first delayed output value, said first output value corresponding to an output value of said circuit.

8. The method of claim 7 wherein said accessing said first input value includes the step of:
   accessing said first input value from said memory, said first input value being in the set of values {Zero, One, X}, where X indicates UNKNOWN.

9. The method of claim 7 wherein said accessing said first delayed input value includes the step of:
   accessing said first delayed input value from said memory, said first delayed input value being in the set of values {Zero, One, X}, where X indicates UNKNOWN.

10. The method of claim 7 wherein said accessing said first delayed output value includes the step of:
    accessing said first delayed output value from said memory, said first delayed output value being in a set of values {Zero, One, X}, where X indicates UNKNOWN.

11. The method of claim 7 wherein said causing said processor to access said first output value from said computer model includes:
    determining an entry in a table in said memory, said table corresponding to said computer model, said determining said entry including a combination of said first input value, said first delayed input value, and said first delayed output value; and
    accessing said first output value from said table at said entry.

12. The method of claim 11 wherein said determining an entry in said table in said memory includes
    determining a state in a Finite State Machine corresponding to said circuit.

13. A method of synthesizing a portion of a circuit from a computer model of a Finite State Machine (FSM) in a computer system, said computer system including a memory and a processor, said memory being coupled to said processor, said memory storing said computer model, said computer implemented method comprising:
    accessing a first set of outputs from said computer model;
    accessing a first set of delayed outputs from said computer model;
    accessing a first set of inputs from said computer model;
    accessing a first set of delayed inputs from said computer model;
    determining a plurality of signal types corresponding to said first set of delayed outputs, said first set of inputs, and said first set of delayed inputs, said determining said plurality of signal types including.
    identifying a first set of synchronous data signal types.
    identifying a first set of asynchronous data signal types.
    identifying a first set of asynchronous reset signal types.
    identifying a first set of asynchronous set signal _types,
    identifying a first set of asynchronous enable signal types,
    identifying a plurality of active levels,
    identifying a plurality of unatenesses, identifying a plurality of edge sensitive signal types, and identifying a plurality of level sensitive signal types; and determining a first circuit primitive corresponding to an output of said first set of outputs and a first signal type of said plurality of signal types.

14. The method of claim 13 wherein said accessing said first set of outputs from said computer model further includes:

executing a synthesis program;

accessing said computer model in response to said synthesis program, said computer model being represented as a table in said memory; and accessing a column of said table, said column corresponding to said first set of outputs.

15. The method of claim 13 wherein said determining said plurality of signal types includes:

identifying a subset of said first set of inputs as being a clock signal type.

16. The method of claim 13 wherein said determining said plurality of signal types includes:

identifying a subset of said first set of inputs as being a preset signal type.

* * * * *